US008364916B2

(12) United States Patent
Yuan

(10) Patent No.: US 8,364,916 B2
(45) Date of Patent: Jan. 29, 2013

(54) METHOD AND APPARATUS FOR IMPLEMENTING INTERLEAVING AND DE-INTERLEAVING AT SECOND TIME

(75) Inventor: Xuelong Yuan, Shenzhen (CN)

(73) Assignee: ZTE Corporation, Shenzhen (CN)

( * ) Notice: Subject to any disclaimer, the term of this patent is extended or adjusted under 35 U.S.C. 154(b) by 285 days.

(21) Appl. No.: 12/999,599

(22) PCT Filed: Jun. 17, 2009

(86) PCT No.: PCT/CN2009/072321
§ 371 (c)(1),
(2), (4) Date: Dec. 16, 2010

(87) PCT Pub. No.: WO2009/152770
PCT Pub. Date: Dec. 23, 2009

(65) Prior Publication Data
US 2011/0087849 A1 Apr. 14, 2011

(30) Foreign Application Priority Data
Jun. 17, 2008 (CN) .......................... 2008 1 0126632

(51) Int. Cl.
G06F 12/00 (2006.01)
(52) U.S. Cl. .............................. 711/157; 711/5; 711/200
(58) Field of Classification Search .................. 711/157, 711/5, 200
See application file for complete search history.

(56) References Cited

U.S. PATENT DOCUMENTS

| 6,151,690 A * | 11/2000 | Peeters ......................... 714/701 |
| 6,950,977 B2 * | 9/2005 | Lavi et al. ..................... 714/794 |
| 7,526,687 B2 * | 4/2009 | Eroz et al. ..................... 714/701 |
| 7,657,797 B2 * | 2/2010 | Eroz et al. ..................... 714/701 |
| 7,761,750 B2 * | 7/2010 | Eroz et al. ..................... 714/701 |
| 2005/0071729 A1 | 3/2005 | Kim |

FOREIGN PATENT DOCUMENTS

| CN | 1917414 A | 2/2007 |
| CN | 1983824 A | 6/2007 |

* cited by examiner

Primary Examiner — Stephen Elmore
(74) Attorney, Agent, or Firm — Kunzler Law Group, PC

(57) ABSTRACT

A method for second interleaving is disclosed. The method comprises: generating an interleaving address preset in an interleaving matrix for each input data, and writing the data into the interleaving matrix according to the interleaving address; initializing the interleaving address and reading out the data from the interleaving matrix according to the interleaving address; judging whether the reading operation on a column of data in the interleaving matrix is completed or not, if completed, then calculating the interleaving address of the next column in the interleaving matrix according to inter-column replacement rules; otherwise, obtaining the interleaving address by adding its own value to the column spacing; judging whether the reading operations on all data are completed or not, if completed, then the second interleaving ending; otherwise, returning to the step of reading out the data from the interleaving matrix according to the interleaving address, and repeating the above operation. A method for second de-interleaving and the corresponding apparatus for second interleaving and de-interleaving are also disclosed.

12 Claims, 4 Drawing Sheets

METHOD AND APPARATUS FOR IMPLEMENTING INTERLEAVING AND DE-INTERLEAVING AT SECOND TIME

FIELD OF THE INVENTION

The present invention relates to interleaving and de-interleaving
technology in mobile communication system, and in particular, to a method and apparatus for second interleaving and de-interleaving.

BACKGROUND

In mobile communication, a transmitted data stream may have bit error due to fading of wireless channels; therefore, it is necessary to process the data stream through channel coding to improve error correcting capability and reliability of data transmission. However, channel coding is only effective when detecting and correcting a single bit error and a bit error string that is not very long, and in practical applications, bit errors often arise in string, and channel coding will not correct errors normally when there is a relatively long bit error string.

In order to solve this problem, it needs to separate the successive bits in a message, i.e., the successive bits in a message are transmitted in an unsuccessive way. In this way, even if errors arise in string in the process of transmission, the bit errors can become errors in single or a short bit string when being restored into a message with a successive bit string, in which case, the initial message can be restored by correcting the errors through channel coding. This method is precisely the interleaving technology, i.e., in the uplink, the data to be transmitted are interleaved, and the successive bits are transmitted in unsuccessive way out of sequence; in the downlink, the interleaved data received are de-interleaved, and the unsuccessive out-of-sequence bits are restored into successive bits. The interleaving process is divided into first and second interleaving in the uplink and corresponding first and second de-interleaving in the downlink.

In the 3rd generation (3G) wireless communication, a data packet can be divided into several data frames, these data frames are transmitted in different transmitting channels respectively, and the transmission time for each data frame is 10 ms. The 3rd generation partnership project (3GPP) protocol specifies different delay requirements, according to which, the time interval for transmitting data may be 10 ms, 20 ms, 40 ms or 80 ms, i.e., 1 data frame, 2 data frames, 4 data frames or 8 data frames may be transmitted respectively. First interleaving means interleaving between data frames, i.e., the above data frames are subjected to inter-frame interleaving before being mapped to the physical channel, rather than directly mapped to the physical channel sequentially; second interleaving means interleaving between data carried in a single physical channel, which uses a method of writing the data into an interleaving matrix, and the specific process of second interleaving comprises the following steps of:

Step 11, constructing an interleaving matrix.

Generally, the number of columns of the interleaving matrix regulated by second interleaving is fixed as 30, while the number of rows is calculated according to the data that need to be transmitted in the channel, i.e., dividing the length M of the data to be transmitted with 30, if it is exactly divided, then the quotient m obtained therefrom is just the number of rows of the interleaving matrix; if it cannot be exactly divided, then the number of rows of the interleaving matrix is m+1. Then a bidimensional array is initialized according to the number of columns and the calculated number of rows, and the address determined by the bidimensional array is used to indicate the interleaving matrix.

Step 12, writing the data to be transmitted into the interleaving matrix one by one according to the sequence of rows, wherein if the length M of the data to be transmitted is not a multiple of 30, i.e., the data to be transmitted cannot fill out the interleaving matrix, so it needs to fill invalid data one by one into the blanks at the end of the last row of the interleaving matrix, and the invalid data can be empty bits.

Step 13, replacing the data in the columns of the interleaving matrix according to the inter-column replacement rule regulated by 3GPP.

Table 1 is a replacement table for columns of interleaving formulated according to inter-column replacement rule, for example, the position of the data in column 0 before interleaving does not change, the data in column 20 before interleaving is replaced by the data in column 1 after interleaving, the data in column 10 before interleaving is replaced by the data in column 2 after interleaving, the data in column 5 before interleaving is replaced by the data in column 3 after interleaving, thus replacing the sequences of all the columns in the interleaving matrix according to the rule. After replacement, the row number and column number of matrix wherein the data is located are obtained.

TABLE 1

| Sequence of column data before interleaving | <0, 1, 2, 3, 4, . . . 26, 27, 28, 29> |
|---|---|
| Sequence of column data after interleaving | <0, 20, 10, 5, 15, 25, 3, 13, 23, 8, 18, 28, 1, 11, 21, 6, 16, 26, 4, 14, 24, 19, 9, 29, 12, 2, 7, 22, 27, 17> |

When the length M of the data to be transmitted is not a multiple of 30, the invalid data stored at the end of the interleaving matrix is also replaced according to the above inter-column replacement rule, for example, when the length M of the data to be transmitted is 27, the interleaving matrix is 1 row×30 column, and the last three columns, i.e., column 27, 28 and 29, store the invalid data. As shown in Table 1, the data in column 27 before interleaving is replaced by the data in column 28 after interleaving, the data in column 28 before interleaving is replaced by the data in column 12 after interleaving, and the data in column 29 before interleaving is replaced by the data in column 24 after interleaving. After interleaving, the invalid data and the data to be transmitted are crosswise arranged in the interleaving matrix.

Step 14, reading out the data to be transmitted from the interleaving matrix after column replacement according to the row number and column number in a sequence of columns, the interleaving process completed.

It should be noted that the invalid data and the data to be transmitted are crosswise arranged in the interleaving matrix, so that if they are sent out indifferentially, unnecessary wideband will be occupied. Therefore, a better method is to calculate whether the end of the interleaving matrix stores invalid data. When reading out each data, it is judged whether the data is invalid data or not. If it is not invalid data, then directly read it out; otherwise, skip it and read out the next data.

The process of second de-interleaving is just opposite to that of second interleaving, and comprises the following steps of:

Step 21, constructing a de-interleaving matrix.

The number of columns of the de-interleaving matrix regulated by second de-interleaving is fixed as 30, while the number of rows is calculated according to the data received in the channel, i.e., dividing the length TV of the received data with 30, if it is exactly divided, then the quotient n obtained therefrom is just the number of rows of the de-interleaving matrix; if it cannot be exactly divided, then the number of rows of the de-interleaving matrix is n+1. Then a bidimensional array is initialized according to the number of columns and the calculated number of rows, and the address determined by the bidimensional array is used to represent the de-interleaving matrix.

Step 22, writing the received data into the de-interleaving matrix one by one according to the sequence of columns, wherein if the length TV of the received data is not a multiple of 30, i.e., the received data cannot fill out the de-interleaving matrix, so it needs to fill invalid data one by one into the blanks at the end of the last row of certain columns of the de-interleaving matrix, and the invalid data can be empty bits.

Step 23, replacing the data in the columns of the de-interleaving matrix according to the inter-column replacement rule regulated by 3GPP.

Table 2 is a replacement table for columns of de-interleaving formulated according to inter-column replacement rule, which is just opposite to that of interleaving, for example, the position of the data in column 0 before de-interleaving does not change, the data in column 1 before de-interleaving is replaced by the data in column 20 after de-interleaving, the data in column 2 before de-interleaving is replaced by the data in column 10 after de-interleaving, the data in column 3 before de-interleaving is replaced by the data in column 5 after de-interleaving, thus replacing the sequences of all the columns in the de-interleaving matrix according to the rule. It can be seen that the data after de-interleaving are restored into the array before data interleaving. After replacement, the row number and column number of the matrix wherein the data is located are obtained.

When the length TV of the received data is not a multiple of 30, the invalid data stored at the end of certain columns of the de-interleaving matrix are also replaced according to the above inter-column replacement rule, for example, when the length TV of the received data is 27, the de-interleaving matrix is 1 row×30 column, and the last three columns, i.e., column 27, 28 and 29, store the invalid data. As shown in Table 1, the data in column 27 before de-interleaving is replaced by the data in column 22 after de-interleaving, the data in column 28 before de-interleaving is replaced by the data in column 27 after de-interleaving, and the data in column 29 before de-interleaving is replaced by the data in column 17 after de-interleaving. Before column replacement, the invalid data and the received data are crosswise arranged in the de-interleaving matrix.

TABLE 2

| sequence of column data before de-interleaving | <0, 1, 2, 3, 4, . . . 26, 27, 28, 29> |
|---|---|
| sequence of column data after de-interleaving | <0, 12, 25, 6, 18, 3, 15, 26, 9, 22, 2, 13, 24, 7, 19, 4, 16, 29, 10, 21, 1, 14, 27, 8, 20, 5, 17, 28, 11, 23> |

Step 24, reading out the received data from the de-interleaving matrix after column replacement according to the row number and column number in a sequence of rows.

It should be noted that when writing data into the de-interleaving matrix, the last rows of certain columns should be filled with invalid data. Therefore, it needs to calculate the filling positions of the invalid data. When reading out each data, it is judged whether the data is invalid data or not. If it is not invalid data, then directly read it out; otherwise, skip it and read out the next data.

It can be seen from the above analysis that the method for interleaving and de-interleaving in the prior art has the following problems:

1) when constructing an interleaving matrix or a de-interleaving matrix, it needs to calculate the number of rows occupied by the data written into the matrix by using division, which is complicated and requires a special division operation unit in terms of hardware.

2) invalid data are filled when the data cannot fill out the interleaving matrix or de-interleaving matrix, correspondingly, it needs to know by calculation which data are invalid data in the matrix, thus increasing the complexity of calculation.

SUMMARY

In view of the above, the main purpose of the present invention is to provide a method and apparatus for second interleaving and de-interleaving which can decrease the complexity of calculation and does not need any special hardware.

In order to achieve the above purpose, the technical scheme of the present invention is carried out as follows:

a method for second interleaving, comprising: generating an interleaving address preset in an interleaving matrix for each input data; the method further comprises the following steps of:

A, writing the data into the interleaving matrix according to a sequence of the interleaving address;

B, initializing the interleaving address and reading out the data from the interleaving matrix according to the interleaving address;

C, judging whether a reading operation on a column of data in the interleaving matrix is completed or not, if completed, then calculating an interleaving address of a next column in the interleaving matrix according to inter-column replacement rules, and executing step D; if not, obtaining the interleaving address by adding a column spacing to its own value;

D, judging whether reading operations on all data are completed or not, if completed, then the second interleaving ending; otherwise, reading out the data from the interleaving matrix according to the current interleaving address, and returning to step C.

Preferably, said step A further comprises the following steps of:

A1, initializing the interleaving address, and writing the data into the interleaving matrix according to the current interleaving address;

A2, adding 1 to a current interleaving address;

A3, judging whether reading operations on all data are completed, if completed, executing step B; otherwise, taking the next data and writing the data into the interleaving matrix according to the current interleaving address, returning to step A2.

Preferably, said step B further comprises initializing a column value;

in step C, if a reading operation on a column of data in the interleaving matrix is completed, the step C further comprises: adding 1 to the column value, and calculating an interleaving address of a next column in the interleaving matrix according to inter-column replacement rules.

Preferably, the inter-column replacement rules are inter-column replacement rules for a matrix with 30 columns specified by 3GPP.

An apparatus for second interleaving, comprising:

an interleaving data writing-in module for receiving data and generating interleaving addresses one by one according to a data receiving sequence and transmitting the interleaving addresses and data to an interleaving storage module respectively;

an interleaving storage module for receiving the interleaving addresses and data of the interleaving data writing-in module, storing the data according to the interleaving addresses of the interleaving data writing-in module, and receiving an interleaving address of an interleaving data reading-out module, transmitting the data to the interleaving data reading-out module according to the interleaving address from the interleaving data reading-out module;

an interleaving end-column judging module for judging whether the interleaving address from the interleaving data writing-in module is an end-column address or not, and transmitting an in-column signal to the interleaving data reading-out module if it is not, and transmitting an end-column signal to an interleaving inter-column conversion module if it is;

an interleaving inter-column conversion module for calculating an interleaving address of a next column according to inter-column replacement rules and an end-column signal from the interleaving end-column judging module, and transmitting the interleaving address to the interleaving data reading-out module;

an interleaving data reading-out module for calculating a next interleaving address of the column according to an in-column signal from the interleaving end-column judging module, and receiving an interleaving address of the interleaving inter-column conversion module; and reading out data one by one from the interleaving storage module according to the interleaving address sent to the interleaving storage module, and sending the data out.

A method for second de-interleaving, comprising the following steps of:

a, initializing a de-interleaving address preset in a de-interleaving matrix, and writing data into the de-interleaving matrix according to the de-interleaving address;

b, judging whether a writing operation on a column of data in the de-interleaving matrix is completed or not, if completed, then calculating a de-interleaving address of a next column in the de-interleaving matrix according to inter-column replacement rules; otherwise, adding a column spacing to the de-interleaving address;

c, judging whether writing operations on all data are completed, if completed, then executing step d; otherwise, taking a next data and writing the data into the de-interleaving matrix according to the de-interleaving address, returning to step b;

d, reading out the data from the de-interleaving matrix according to a sequence of the de-interleaving address.

Preferably, said step d further comprises:

d1, initializing the de-interleaving address and reading out the data from the de-interleaving matrix according to the de-interleaving address;

d2, adding 1 to a current interleaving address;

d3, judging whether reading operations on all data are completed, if completed, then second de-interleaving ending; otherwise, reading out the data from the de-interleaving matrix according to the current de-interleaving address, returning to step d2.

Preferably, said step a further comprises initializing a column value;

in step b, if a writing operation on a column of data in the de-interleaving matrix is completed, the step b further comprises: adding 1 to the column value, and calculating a de-interleaving address of a next column in the de-interleaving matrix according to inter-column replacement rules.

Preferably, the inter-column replacement rules are inter-column replacement rules for a matrix with 30 columns specified by 3GPP.

An apparatus for second de-interleaving, comprising:

a de-interleaving data writing-in module for receiving data, calculating a next de-interleaving address in a column according to an in-column signal from a de-interleaving end-column judging module, and receiving a de-interleaving address of a de-interleaving inter-column conversion module and transmitting the de-interleaving address and data to a de-interleaving storage module;

a de-interleaving storage module for receiving the de-interleaving address and data of the de-interleaving data writing-in module, storing the data according to the de-interleaving address of the de-interleaving data writing-in module, and receiving a de-interleaving address of a de-interleaving data reading-out module, transmitting the data to the de-interleaving data reading-out module according to the de-interleaving address from the de-interleaving data reading-out module;

a de-interleaving end-column judging module for judging whether the de-interleaving address from the de-interleaving data writing-in module is an end-column address or not, and transmitting an in-column signal to the de-interleaving data reading-out module if it is not and transmitting an end-column signal to a de-interleaving inter-column conversion module if it is;

a de-interleaving inter-column conversion module for calculating a de-interleaving address of a next column according to inter-column replacement rules and an end-column signal from the de-interleaving end-column judging module, and transmitting the de-interleaving address to the de-interleaving data writing-in module;

a de-interleaving data reading-out module for generating de-interleaving addresses one by one according to a data transmitting sequence and transmitting the generated de-interleaving addresses to the de-interleaving storage module, and reading out data one by one from the de-interleaving storage module according to the de-interleaving addresses sent to the de-interleaving storage module, and sending the data out.

The present invention determines the position of the data in an interleaving matrix or a de-interleaving matrix according to an interleaving address or a de-interleaving address without calculating the row number and column number of the matrix where the data is located, i.e., an interleaving matrix and a de-interleaving matrix can be constructed without calculating the number of rows of the interleaving matrix and the de-interleaving matrix, thus avoiding undesirable division operation and saving a corresponding division operation unit, and reducing the area of the chip, which complies with the developing trend of small volume and low power consumption for a mobile communication terminal and possesses good practical value.

In the present invention, when the data is read out from an interleaving matrix column by column or written into a de-interleaving matrix column by column, an interleaving address or a de-interleaving address is generated for each data, and the corresponding data is directly written into the interleaving matrix or the de-interleaving matrix according to the interleaving address or the de-interleaving address, without writing the corresponding data into the interleaving matrix or the de-interleaving matrix according to row number and column number or writing invalid data. This method avoids the step of calculating whether each column in the last row in an interleaving matrix or a de-interleaving matrix is invalid data or not in the prior art, thus reducing the complexity of calculating operation and improving operating efficiency.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION

Figure 1:
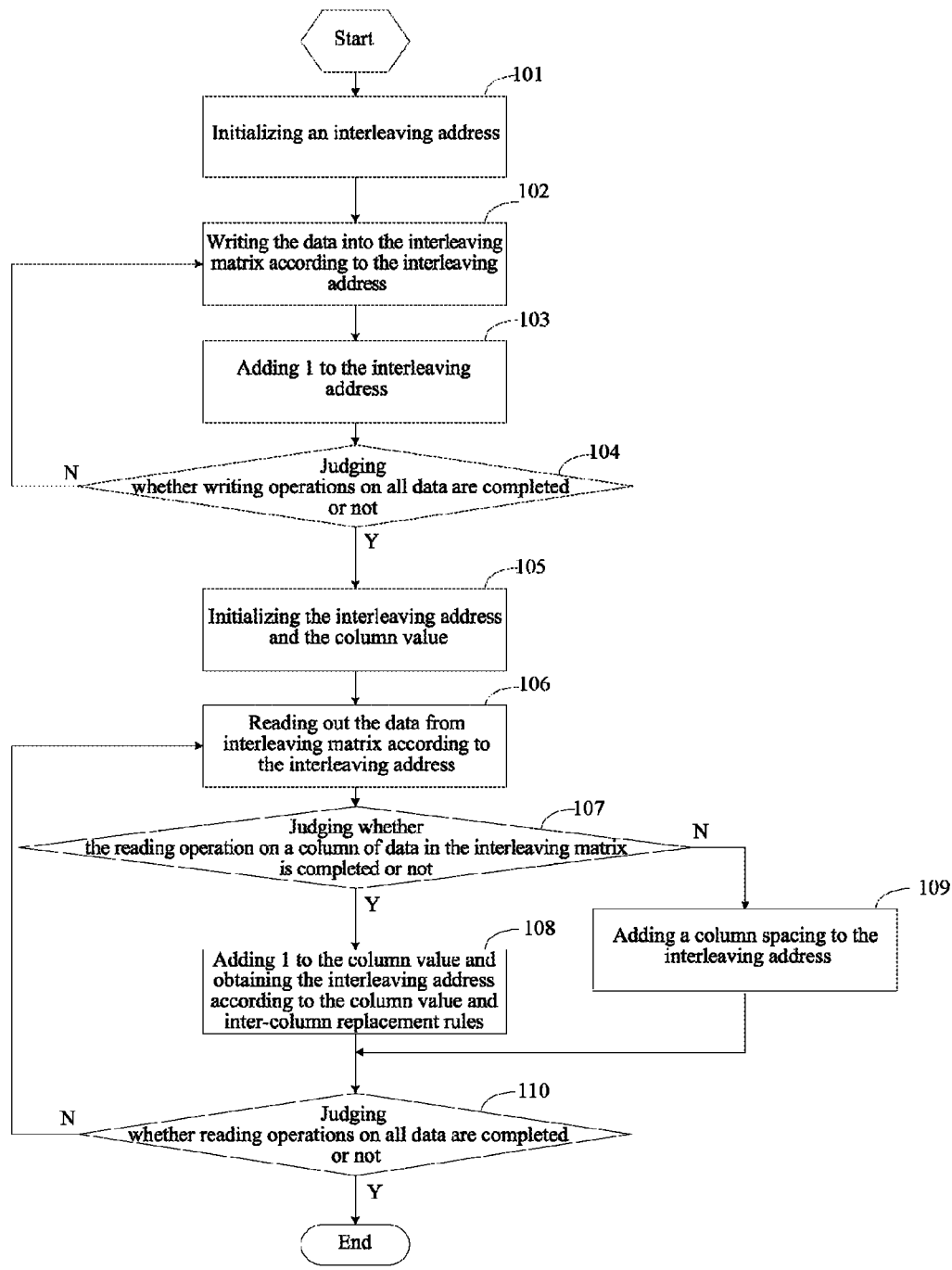
FIG. 1 illustrates a flow of carrying out the method for second interleaving processing according to the present invention.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

The schematic flow chart diagrams included herein are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

Different from the method in the prior art for determining the position of the data in an interleaving matrix or a de-interleaving matrix using row number and column number, the present invention determines the position of the data in an interleaving matrix or a de-interleaving matrix using interleaving address or de-interleaving address, and the calculating operation is more convenient.

Specifically, the interleaving address or de-interleaving address with respect to the sequence of rows in the matrix is: the interleaving address at row 0 and column 0 in an interleaving matrix is 0, the interleaving address at row 0 and column 1 is 1, the interleaving address at row 0 and column 29 is 29, the interleaving address at row 1 and column 0 is 30, and so forth. If the length of the data to be transmitted is M, then the number of required interleaving addresses is also M. Generally, the interleaving addresses are 0~M−1, and the value of the interleaving address is always smaller than the length of the data to be transmitted. The sequence of the de-interleaving addresses is the same with the interleaving addresses and is always smaller than the length of the received data.

The technical scheme of the present invention will be further described in detail below with reference to accompanying drawings and specific examples.

FIG. 1 illustrates a flow of carrying out the method for second interleaving processing according to the present invention. As shown in FIG. 1, the method comprises the following steps of:

Step 101: initializing an interleaving address;

Where, the interleaving address can be initialized as 0.

Step 102: writing the data into where the current interleaving address of the interleaving matrix indicates.

Step 103: adding 1 to the interleaving address.

Step 104: judging whether writing operations on all data are completed, if completed, then executing Step 105; otherwise, then executing Step 102.

Here, since the interleaving address is always smaller than the length of the data to be transmitted, i.e., the maximum of interleaving address is M−1, it only needs to judge whether the interleaving address is greater than M−1, if yes, it means that writing operations on all data have been completed; if not, then it means that writing operations on all data are not completed yet.

Through the cyclic writing operation from Step 102 to Step 104, M data to be transmitted can be written into the corresponding positions in the interleaving matrix according to the interleaving addresses that are sequentially generated.

Step 105: initializing the interleaving address and the column value, wherein the interleaving address and the column value can be both initialized as 0.

Step 106: reading out the data from the corresponding position of the interleaving matrix according to the current interleaving address.

Step 107: judging whether the reading operation of a column of data in the interleaving matrix is completed or not, if completed, then executing Step 108; otherwise, executing Step 109.

Here, since the interleaving matrix is a matrix with 30 columns and the last 30 interleaving addresses must be located at the end of the columns in the interleaving matrix, it only needs to judge whether the interleaving address is greater than M−31, if yes, it means that the reading operation of a column of data in the interleaving matrix has been completed; if not, then it means that the reading operation of a column of data in the interleaving matrix is not completed yet.

Step 108: adding 1 to the column value, and calculating the interleaving address of the next column in the interleaving matrix according to inter-column replacement rules corresponding to the column value, executing Step 110.

Here, the inter-column replacement rules may be the inter-column replacement rules for a matrix with 30 columns specified by 3GPP.

Step 109: adding a column spacing to the interleaving address.

Here, the column spacing is the column difference between adjacent interleaving addresses, and since the interleaving matrix used in the present invention is a matrix with 30 columns, the column spacing is 30. Therefore, the next interleaving address of the column can be obtained by adding 30 to the interleaving address.

In practical applications, the interleaving matrix is not limited to a matrix with 30 columns, and other interleaving matrixes can also be used. No matter which kind of matrix is used, the process is similar to the present one, so it will not be elaborated here.

Step 110: judging whether reading operations of all data are completed, if not completed, then executing Step 106; if completed, then the second interleaving is over.

Here, since the interleaving address is always smaller than the length M of the data to be transmitted, i.e., the maximum of interleaving address is M−1, it only needs to judge whether the interleaving address is greater than M−1, if yes, the second interleaving process is over; if not, then executing Step 106.

When reading out data through Step 106 to Step 110, it is judged whether the reading operation of a column of data in the interleaving matrix is completed through Step 107, if not completed, then read on one by one according to the next address of the column obtained in Step 109; if completed, then converting to the next column to read out data sequentially according to the interleaving address of the next column obtained through calculation in Step 108 according to inter-column replacement rules. This whole process is repeated until reading operations of all data are completed.

Figure 2:
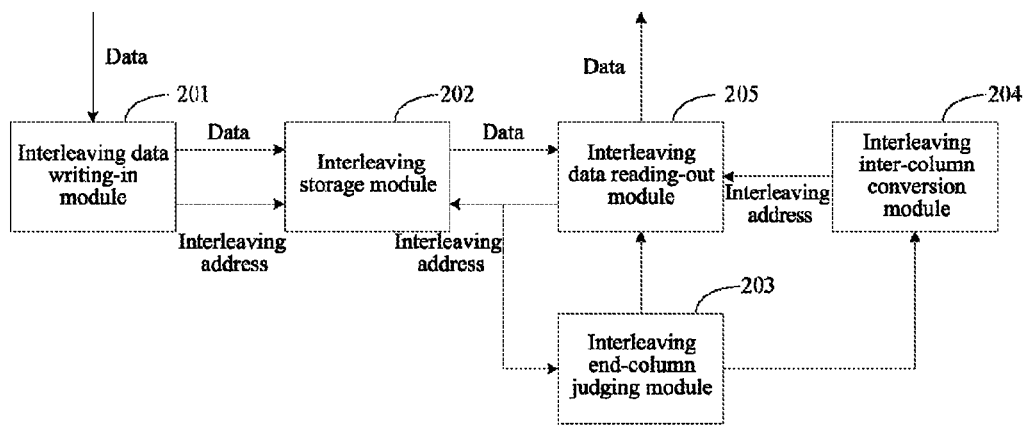
FIG. 2 illustrates the composing structure of an apparatus for second interleaving according to the present invention.

FIG. 2 illustrates the composing structure of an apparatus for second interleaving according to the present invention. As shown in FIG. 2, the apparatus comprises:

an interleaving data writing-in module 201 for receiving data sent to the second interleaving apparatus from outside and generating interleaving addresses one by one according to a data receiving sequence and transmitting the interleaving addresses and the data to an interleaving storage module 202.

Wherein, when receiving each datum, the interleaving data writing-in module 201 generates an interleaving address for the datum, and the interleaving address can be firstly initialized as 0. After the data is read out according to the current interleaving address, the interleaving address is added with 1 to obtain the interleaving address of the next data.

an interleaving storage module 202 for receiving the interleaving addresses and data transmitted by the interleaving data writing-in module 201, storing the data according to the interleaving addresses of the interleaving data writing-in module 201; also for receiving interleaving addresses transmitted by an interleaving data reading-out module 205, transmitting the data corresponding to the interleaving addresses transmitted by the interleaving data reading-out module 205 to the interleaving data reading-out module 205;

an interleaving end-column judging module 203 for judging whether the interleaving address transmitted by the interleaving data writing-in module 201 and stored in the interleaving data storage module 205 is an end-column address or not; transmitting an in-column signal to the interleaving data reading-out module 205 if it is not and transmitting an end-column signal to an interleaving inter-column conversion module 204 if it is.

Since the interleaving matrix is a matrix with 30 columns, the last 30 interleaving addresses must be located at the end of the columns of the interleaving matrix. It is judged according to the length M of the data to be transmitted whether the interleaving address is greater than M−31, i.e., it is judged whether the interleaving address belongs to the last 30 interleaving addresses, thus concluding whether the interleaving address is an end-column address or not.

an interleaving inter-column conversion module 204 for calculating an interleaving address of a next column according to an end-column signal transmitted from the interleaving end-column judging module 203, and transmitting the calculated interleaving address to the interleaving data reading-out module 205.

Whenever receiving an end-column signal, the interleaving inter-column conversion module 204 adds 1 to the column value, calculates the interleaving address after conversion corresponding to the current column value according to inter-column replacement rules, and transmitting the converted interleaving address to the interleaving data reading-out module 205.

an interleaving data reading-out module 205 for calculating a next interleaving address of the column according to an in-column signal transmitted from the interleaving end-column judging module 203; also for receiving an interleaving address transmitted from the interleaving inter-column conversion module 204, and transmitting the interleaving address to the interleaving storage module 202; also for reading out data one by one from the interleaving storage module 202 according to the interleaving address sent from itself to the interleaving storage module 202, and sending the data out from the second interleaving apparatus.

When the interleaving data reading-out module 205 reads out the data, the interleaving address may be firstly initialize as 0, and then is transmitted to both the interleaving storage module 202 and the interleaving end-column judging module 203. The interleaving storage module 202 transmits the data corresponding to the current interleaving address to the interleaving data reading-out module 205; the interleaving end-column judging module 203 judges whether the current interleaving address is an end-column address or not, if it is not, the interleaving data reading-out module 205 adds 30 to the current interleaving address to obtain the interleaving address of the next data; if it is, the interleaving address of the next data is obtained through calculating by the interleaving inter-column conversion module 204.

Figure 3:
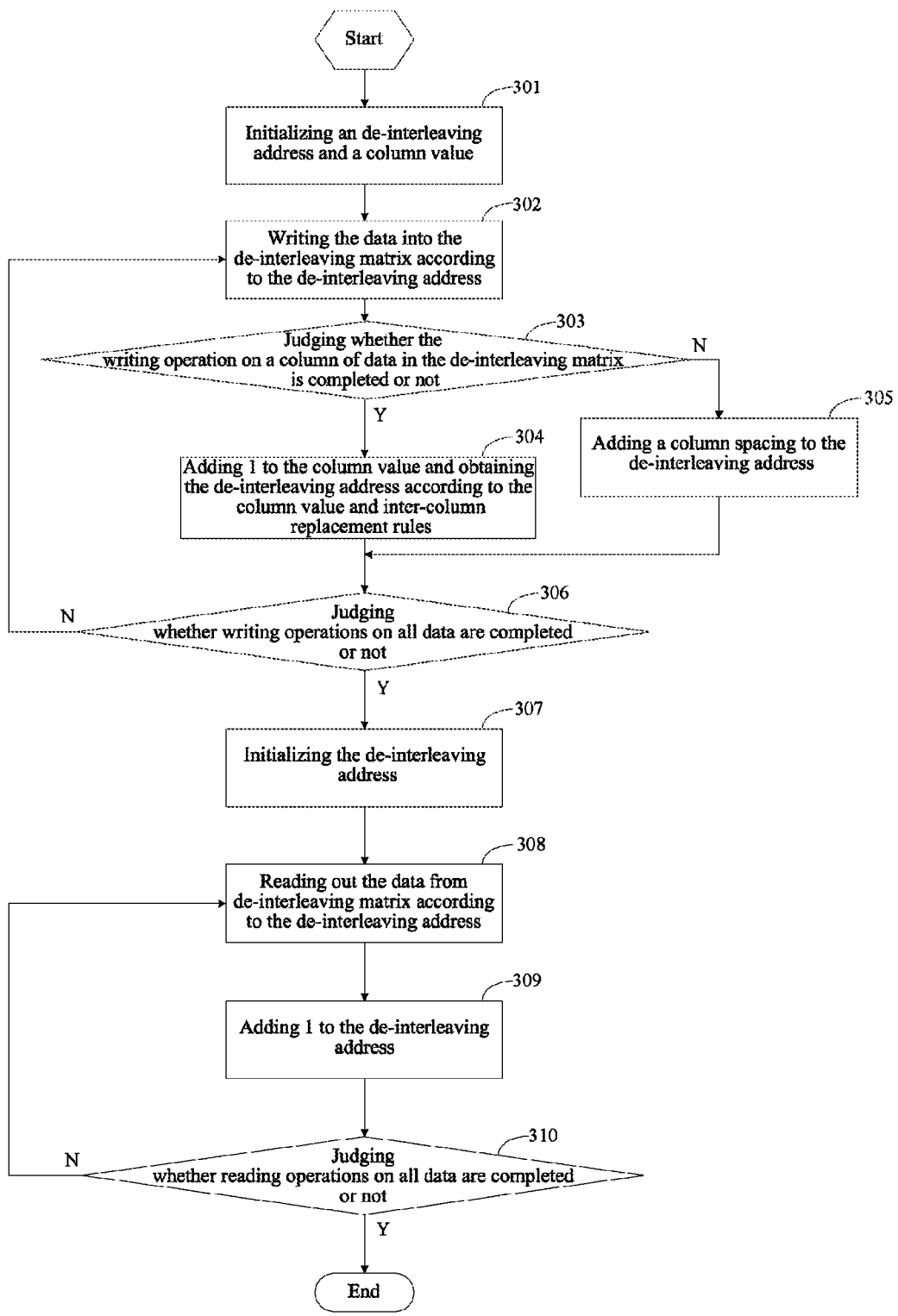
FIG. 3 illustrates a flow of carrying out the method for second de-interleaving processing according to the present invention.

FIG. 3 illustrates a flow of carrying out the method for second de-interleaving processing according to the present invention. As shown in FIG. 3, the method comprises the following steps of:

Step 301: initializing a de-interleaving address and a column value.

wherein the de-interleaving address can be initialized as 0.

Step 302: writing the data into the de-interleaving matrix according to the de-interleaving address.

Step 303: judging whether the writing operation of a column of data in the de-interleaving matrix is completed or not, if completed, then executing Step 304; otherwise, executing Step 305.

Here, since the de-interleaving matrix is a matrix with 30 columns, the last 30 de-interleaving addresses must be located at the end of the columns in the de-interleaving matrix. Moreover, since the length of the received data is N, it only needs to judge whether the de-interleaving address is greater than N−31, if yes, it means that the writing operation of a column of data in the de-interleaving matrix has been completed; if not, then it means that the writing operation of a column of data in the de-interleaving matrix is not completed yet.

Step 304: adding 1 to the column value, and calculating the de-interleaving address of the next column in the de-interleaving matrix according to inter-column replacement rules corresponding to the column value, executing Step 306.

Here, the inter-column replacement rules may be the inter-column replacement rules for a matrix with 30 columns specified by 3GPP.

Step 305: adding a column spacing to the de-interleaving address.

Here, the column spacing is the column difference between adjacent de-interleaving addresses, and since the de-interleaving matrix used in the present invention is a matrix with 30 columns, the column spacing is 30. Therefore, the next de-interleaving address of the column can be obtained by adding 30 to the de-interleaving address.

In practical applications, the de-interleaving matrix is not limited to a matrix with 30 columns, and other de-interleaving matrixes can also be used. No matter which kind of de-interleaving matrix is used, the process is similar to the present one, so it will not be elaborated here.

Step 306: judging whether writing operations on all data are completed, if completed, then executing Step 307; otherwise, then executing Step 302.

Here, since the de-interleaving address is always smaller than the length TV of the received data, i.e., the maximum of de-interleaving address is N−1, it only needs to judge whether the de-interleaving address is greater than N−1, if yes, it means that writing operations on all data have been completed; if not, then it means that writing operations on all data are not completed yet.

When writing in data through Step 302 to Step 306, it is judged whether the writing operation on a column of data in the de-interleaving matrix is completed through Step 303, if not completed, then write on one by one according to the next address of the column obtained in Step 305; if completed, then proceeding to the next column to write in data sequentially according to the de-interleaving address of the next column obtained through calculation in Step 304 according to inter-column replacement rules. This whole process is repeated until writing operations on all data are completed.

Step 307: initializing the de-interleaving address.

Wherein the de-interleaving address can be initialized as 0.

Step 308: reading out the data from the de-interleaving matrix according to the de-interleaving address.

Step 309: adding 1 to the de-interleaving address.

Step 310: judging whether reading operations on all data are completed, if not completed, then executing Step 308; if completed, then the second de-interleaving process is over.

Here, since the de-interleaving address is always smaller than the length TV of the received data, i.e., the maximum of de-interleaving address is N−1, it only needs to judge whether the de-interleaving address is greater than N−1, if yes, it means that reading operations on all data have been completed; if not, then it means that reading operations on all data are not completed yet.

Through the cyclic reading operation from Step 308 to Step 310, N received data can be read out from the corresponding positions in the de-interleaving matrix according to the de-interleaving addresses that are sequentially generated.

Figure 4:
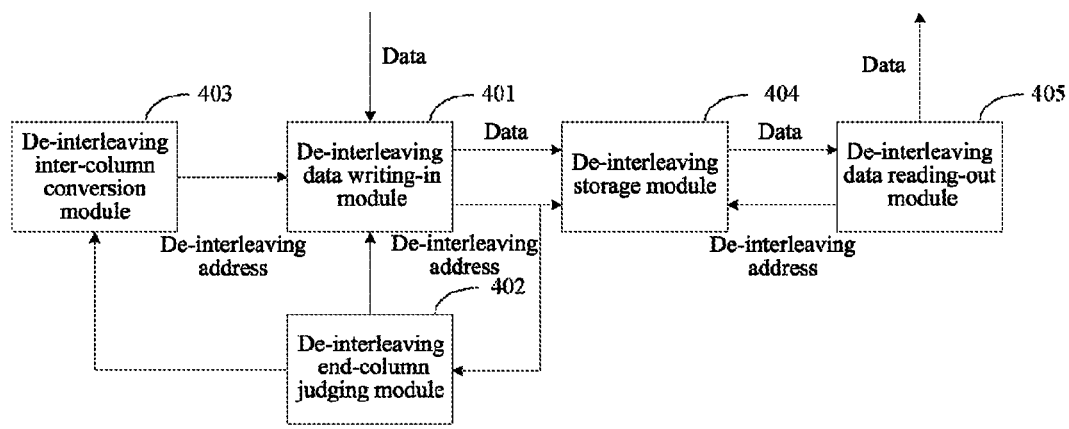
FIG. 4 illustrates the composing structure of an apparatus for second de-interleaving according to the present invention.

FIG. 4 illustrates the composing structure of an apparatus for second de-interleaving according to the present invention. As shown in FIG. 4, the apparatus comprises:

a de-interleaving data writing-in module 401 for receiving data sent to the second de-interleaving apparatus from outside; also for calculating a next de-interleaving address in the column according to an in-column signal transmitted from a de-interleaving end-column judging module 402; for receiving a de-interleaving address transmitted from a de-interleaving inter-column conversion module 403, and respectively transmitting the de-interleaving address and data to a de-interleaving storage module 404.

When the de-interleaving data writing-in module 401 writes in the data, the de-interleaving address may be firstly initialize as 0, and then is transmitted to both the de-interleaving storage module 404 and the de-interleaving end-column judging module 402; the de-interleaving end-column judging module 402 judges whether the current de-interleaving address is an end-column address or not, if it is not, the de-interleaving data writing-in module 401 adds 30 to the current de-interleaving address to obtain the de-interleaving address of the next data; if it is, the de-interleaving address of the next data is obtained through calculating by the de-interleaving inter-column conversion module 403.

a de-interleaving storage module 404 for receiving the de-interleaving address and data transmitted from the de-interleaving data writing-in module 401, storing the data according to the de-interleaving address transmitted from the de-interleaving data writing-in module 401; also for receiving a de-interleaving address transmitted from a de-interleaving data reading-out module 405, and transmitting the data corresponding to the de-interleaving address transmitted from the de-interleaving data reading-out module 405 to the de-interleaving data reading-out module 405.

a de-interleaving end-column judging module 402 for judging whether the de-interleaving address received by the de-interleaving data writing-in module 401 is an end-column address or not according to the de-interleaving address, and transmitting an in-column signal to the de-interleaving data writing-in module 401 if it is and transmitting an end-column signal to a de-interleaving inter-column conversion module 403 if it is not.

Since the de-interleaving matrix is a matrix with 30 columns, the last 30 de-interleaving addresses must be located at the end of the columns of the de-interleaving matrix. It is judged according to the length TV of the received data whether the de-interleaving address is greater than N−31, i.e., it is judged whether the de-interleaving address is the last 30 de-interleaving addresses, thus concluding whether the de-interleaving address is an end-column address or not.

a de-interleaving inter-column conversion module 403 for calculating a de-interleaving address of a next column according to an end-column signal from the de-interleaving end-column judging module 402, and transmitting the de-interleaving address of the next column to the de-interleaving data writing-in module 401.

Whenever receiving an end-column signal, the de-interleaving inter-column conversion module 403 adds 1 to the column value, calculates the de-interleaving address after conversion corresponding to the current column value according to inter-column replacement rules, and transmitting the de-interleaving address to the de-interleaving data writing-in module 401.

a de-interleaving data reading-out module 405 for generating de-interleaving addresses one by one according to a data transmitting sequence and transmitting the de-interleaving addresses to the de-interleaving storage module 404, and reading out data one by one from the de-interleaving storage module 404 according to the de-interleaving addresses sent to the de-interleaving storage module 404, and sending the data out from the second de-interleaving apparatus.

When reading out the data, the de-interleaving data reading-out module 405 may firstly initialize the de-interleaving address as 0, and after reading out the data according to the current de-interleaving address, adds 1 to the de-interleaving address to obtain the de-interleaving address of the next data.

The above is only preferred examples of the present invention, and is not intended to limit the protection scope of the present invention.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

Industrial Applicability

The present invention determines the position of the data in an interleaving matrix or a de-interleaving matrix according to an interleaving address or a de-interleaving address without calculating the row number and column number of the matrix where the data is located, i.e., an interleaving matrix and a de-interleaving matrix can be constructed without calculating the number of rows of the interleaving matrix and the de-interleaving matrix, thus avoiding undesirable division operation and saving a corresponding division operation unit, and reducing the area of the chip, which complies with the developing trend of small volume and low power consumption for a mobile communication terminal and has good industrial applicability.

What is claimed is:

1. A method for second interleaving, comprising:
   generating an interleaving address preset in an interleaving matrix for each input data;
   writing the data into the interleaving matrix according to a sequence of the interleaving address;
   initializing the interleaving address and reading out the data from the interleaving matrix according to the interleaving address;
   judging whether a reading operation on a column of data in the interleaving matrix is completed;
   obtaining the interleaving address by adding a column spacing to the interleaving address's own value in response to judging that the reading operation is not completed;
   calculating an interleaving address of a next column in the interleaving matrix according to inter-column replacement rules in response to judging that the reading operation is completed;
   judging whether reading operations on all data are completed; and
   reading out the data from the interleaving matrix according to the current interleaving address in response to judging that reading operations on all data are completed.

2. The method according to claim 1, wherein writing the data into the interleaving matrix according to the sequence of the interleaving address further comprises:
   initializing the interleaving address, and writing the data into the interleaving matrix according to the current interleaving address;
   adding 1 to the current interleaving address;
   judging whether writing operations on all data are completed;
   initializing the interleaving address and reading out the data from the interleaving matrix according to the interleaving address in response to judging that writing operations on all data are completed; and
   taking a next data and writing the data into the interleaving matrix according to the current interleaving address in response to judging that writing operations on all data are not completed.

3. The method according to claim 1, wherein, initializing the interleaving address and reading out the data from the interleaving matrix according to the interleaving address further comprises initializing a column value, wherein calculating the interleaving address of the next column in the interleaving matrix according to inter-column replacement rules further comprises adding 1 to the column value, and calculating the interleaving address of the next column in the interleaving matrix according to inter-column replacement rules corresponding to the column value.

4. The method according to claim 3, wherein, the inter-column replacement rules are inter-column replacement rules for a matrix with 30 columns specified by 3rd Generation Partnership Project ("3GPP").

5. The method according to claim 1, wherein, the inter-column replacement rules are inter-column replacement rules for a matrix with 30 columns specified by 3rd Generation Partnership Project ("3GPP").

6. An apparatus for second interleaving, comprising: an interleaving data writing-in module, an interleaving storage module, an interleaving end-column judging module, an interleaving inter-column conversion module, and an interleaving data reading-out module,
   the interleaving data writing-in module for receiving data sent to the second interleaving apparatus and for generating interleaving addresses one by one according to a data receiving sequence and transmitting the interleaving addresses and the data to the interleaving storage module;
   the interleaving storage module for receiving the interleaving addresses and the data sent by the interleaving data writing-in module, storing the data according to the interleaving addresses sent by the interleaving data writing-in module; and for receiving an interleaving address sent by the interleaving data reading-out module and transmitting data corresponding to the interleaving address sent by the interleaving data reading-out module to the interleaving data reading-out module;
   the interleaving end-column judging module for judging whether the interleaving address generated by the interleaving data writing-in module is an end-column address, transmitting an in-column signal to the interleaving data reading-out module in response to judging that the interleaving address generated by the interleaving data writing-in module is not an end-column address, and transmitting an end-column signal to the interleaving inter-column conversion module in response to judging that the interleaving address generated by the interleaving data writing-in module is an end-column address;
   the interleaving inter-column conversion module for calculating an interleaving address of a next column according to inter-column replacement rules and the end-column signal from the interleaving end-column judging module, and transmitting the calculated interleaving address to the interleaving data reading-out module;
   the interleaving data reading-out module for calculating a next interleaving address of the column according to the in-column signal from the interleaving end-column judging module and receiving an interleaving address sent by the interleaving inter-column conversion module; and reading out data one by one from the interleaving storage module according to the interleaving address sent from the interleaving data reading-out module to the interleaving storage module, and sending the data out of the second interleaving apparatus.

7. A method for second de-interleaving, comprising:
initializing a de-interleaving address preset in a de-interleaving matrix, and writing data into the de-interleaving matrix according to the de-interleaving address;
judging whether a writing operation on a column of data in the de-interleaving matrix is completed;
calculating a de-interleaving address of a next column in the de-interleaving matrix according to inter-column replacement rules in response to judging that the writing operation is completed;
adding a column spacing to the de-interleaving address in response to judging that the writing operation is not completed;
judging whether writing operations on all data are completed;
taking a next data and writing the data into the de-interleaving matrix according to the de-interleaving address in response to judging that writing operations on all data are not completed; and
reading out the data from the de-interleaving matrix according to a sequence of the de-interleaving address in response to judging that writing operations on all data are completed.

8. The method according to claim 7, wherein, reading out the data from the de-interleaving matrix according to the sequence of the de-interleaving address further comprises:
initializing the de-interleaving address and reading out the data from the de-interleaving matrix according to the de-interleaving address;
adding 1 to a current interleaving address; and
judging whether reading operations on all data are completed;
reading out the data from the de-interleaving matrix according to the current de-interleaving address in response to judging that reading operations on all data are not completed.

9. The method according to claim 7, wherein, initializing the de-interleaving address preset in the de-interleaving matrix, and writing data into the de-interleaving matrix according to the de-interleaving address further comprises initializing a column value, wherein calculating the de-interleaving address of the next column in the de-interleaving matrix according to inter-column replacement rules further comprises adding 1 to the column value and calculating a de-interleaving address of a next column in the de-interleaving matrix according to inter-column replacement rules corresponding to the column value.

10. The method according to claim 9, wherein, the inter-column replacement rules are inter-column replacement rules for a matrix with 30 columns specified by 3rd Generation Partnership Project ("3GPP").

11. The method according to claim 7, wherein, the inter-column replacement rules are inter-column replacement rules for a matrix with 30 columns specified by 3rd Generation Partnership Project ("3GPP").

12. An apparatus for second de-interleaving, comprising: a de-interleaving data writing-in module, a de-interleaving storage module, a de-interleaving end-column judging module, a de-interleaving inter-column conversion module, and a de-interleaving data reading-out module,
the de-interleaving data writing-in module for receiving data sent to the apparatus for second de-interleaving, calculating a next de-interleaving address in the column according to an in-column signal from the de-interleaving end-column judging module, and for receiving a de-interleaving address of the de-interleaving inter-column conversion module and transmitting the de-interleaving address and the data to the de-interleaving storage module;
the de-interleaving storage module for receiving the de-interleaving address and the data sent by the de-interleaving data writing-in module, storing the data according to the de-interleaving address sent by the de-interleaving data writing-in module, receiving a de-interleaving address sent by the de-interleaving data reading-out module, and transmitting data corresponding to the de-interleaving address sent by the de-interleaving data reading-out module to the de-interleaving data reading-out module;
the de-interleaving end-column judging module for judging whether the de-interleaving address received by the de-interleaving data writing-in module is an end-column address, and transmitting an in-column signal to the de-interleaving data reading-out module in response to judging that the de-interleaving address received by the de-interleaving data writing-in module is not an end-column address and transmitting an end-column signal to the de-interleaving inter-column conversion module in response to judging that the de-interleaving address received by the de-interleaving data writing-in module is an end-column address;
the de-interleaving inter-column conversion module for calculating a de-interleaving address of a next column according to inter-column replacement rules and the end-column signal from the de-interleaving end-column judging module, and transmitting the calculated de-interleaving address to the de-interleaving data writing-in module;
the de-interleaving data reading-out module for generating de-interleaving addresses one by one according to a data transmitting sequence and transmitting the generated de-interleaving addresses to the de-interleaving storage module, reading out data one by one from the de-interleaving storage module according to the de-interleaving addresses sent from the de-interleaving data reading-out module to the de-interleaving storage module, and sending the data out of the apparatus for second de-interleaving.

* * * * *